US011056531B2

(12) United States Patent
Cumming et al.

(10) Patent No.: US 11,056,531 B2
(45) Date of Patent: Jul. 6, 2021

(54) METHOD OF FABRICATING A MONOLITHIC SENSOR DEVICE FROM A LAYERED STRUCTURE

(71) Applicant: The University Court of the University of Glasgow, Glasgow (GB)

(72) Inventors: David Robert Sime Cumming, Glasgow (GB); Chengzhi Xie, Glasgow (GB); Vincenzo Pusino, Glasgow (GB)

(73) Assignee: The University Court of the University of Glasgow, Glasgow (GB)

( * ) Notice: Subject to any disclaimer, the term of this patent is extended or adjusted under 35 U.S.C. 154(b) by 21 days.

(21) Appl. No.: 16/619,444

(22) PCT Filed: Jun. 1, 2018

(86) PCT No.: PCT/EP2018/064464
§ 371 (c)(1),
(2) Date: Dec. 4, 2019

(87) PCT Pub. No.: WO2018/224403
PCT Pub. Date: Dec. 13, 2018

(65) Prior Publication Data

US 2020/0168659 A1 May 28, 2020

(30) Foreign Application Priority Data

Jun. 6, 2017 (GB) ..................................... 1709006

(51) Int. Cl.

| | |
|---|---|
| ***H01L 27/146*** | (2006.01) |
| ***H01L 21/02*** | (2006.01) |
| ***H01L 31/0304*** | (2006.01) |
| ***H01L 31/103*** | (2006.01) |

(52) U.S. Cl.
CPC .. *H01L 27/14694* (2013.01); *H01L 21/02068* (2013.01); *H01L 27/14614* (2013.01);
(Continued)

(58) Field of Classification Search
None
See application file for complete search history.

(56) References Cited

U.S. PATENT DOCUMENTS 5,107,319 A * 4/1992 Lauterbach ......... H01L 27/1443 257/195
5,710,439 A * 1/1998 Ohkubo .............. H01L 27/1443 257/103
(Continued)

OTHER PUBLICATIONS

International Search Report issued in corresponding International Patent Application No. PCT/EP2018/064464 dated Aug. 28, 2018.
(Continued)

*Primary Examiner* — Benjamin P Sandvik
(74) *Attorney, Agent, or Firm* — Troutman Pepper Hamilton Sanders LLP

(57) ABSTRACT

A method of fabricating a field-effect transistor in which a native oxide layer is removed prior to etching a gate recess. The cleaning step ensures that the etch of the gate recess starts at the same time across an entire sample, such that a uniform gate recess depth and profile can be achieved across an array of field-effect transistors. This results in a highly uniform switch-off voltage for the field-effect transistors in the array.

25 Claims, 14 Drawing Sheets

(52) U.S. Cl.
CPC .. *H01L 27/14649* (2013.01); *H01L 27/14689* (2013.01); *H01L 31/0304* (2013.01); *H01L 31/1035* (2013.01)

(56) References Cited

U.S. PATENT DOCUMENTS

| | | | | |
|---|---|---|---|---|
| 10,643,993 | B2 * | 5/2020 | Lin | H01L 27/0727 |
| 2010/0248676 | A1 * | 9/2010 | Takahashi | H01L 29/7787 455/341 |
| 2013/0299841 | A1 * | 11/2013 | Ranglack | H01L 31/03044 257/76 |
| 2014/0299885 | A1 * | 10/2014 | Lee | H01L 21/02507 257/76 |
| 2015/0028391 | A1 * | 1/2015 | Takahashi | H01L 29/88 257/195 |

OTHER PUBLICATIONS

Patents Act 1977: Search Report under Section 17(5) issued in corresponding United Kingdom Patent Applicaion No. GB 1709006.9 dated Dec. 6, 2017.

Xie, C., et al. "Monolithic Integration of an Active InSb-Based Mid-Infared Photopixel With a GaAs MESFET" IEEE Transactions on Electron Devices, 62(12):4069-4075 (Dec. 2015), XP 011590708 cited in GB SR issued in GB 1709006.9 dated Dec. 6, 2017and ISR issued in PCT/EP2018/064464 dated Aug. 28, 2018.

Lee, Y.-S., et al., "Selective reactive ion etching of GaAs/AlAs in BC13/SF6 for gate recess" J. Vac. Sci. Technol B 18 (5):2505-2508, Sep./Oct. 2000 cited in GB SR issued in GB 1709006.9 dated Dec. 6, 2017.

Xie, C., et al. "A New Monolithic Approach for Mid-IR Focal Plane Arrays" Proceedings of SPIE, SPIE, 1000 20th St, Bellingham WA 98225-6705 USA vol. 9987 Oct. 20, 2016, pp. 99870T-1 to 99870T-8 (9 pages in total), XP060079783 cited in ISR issued in PCT/EP2018/064464 dated Aug. 28, 2018.

Xie, C., "A novel monolithic focal plane array for mid-IR imaging (Dissertation)" PhD Thesis, pp. 1-178 (204 pages in total), XP055499872, University of Glasgow, 2016, Retrieved from the Internet: URL:http://theses.gla.ac.Uk/8106//2016XiePHd.pdf cited in ISR issued in PCT/EP2018/064464 dated Aug. 28, 2018.

* cited by examiner

Standard process

Improved process

900

904, 902, 708, 706, 704, 702

| | Thickness (nm) | Material | Dopant | Type | Carrier Conc |
|---|---|---|---|---|---|
| p+ top contact | 100 | InSb | Be | p+ | 7.0E+17 |
| Barrier | 20 | $Al_{0.11}In_{0.89}Sb$ | Be | p+ | 7.0E+17 |
| p+ absorption layer | 2000 | InSb | Be | p+ | graded from 5.0E+18 to 7.0E+17 (bottom to top) |
| UD multiplication layer (and buffer) | 3000 | GaSb | | | |
| n+ back contact | 600 | GaAs | Si | n+ | 2.0E+18 |
| GaAs channel | 300 | GaAs | Si | n | 1.0E+17 |
| UD GaAs buffer | 500 | GaAs | | | |
| GaAs Substrate | 600000 | GaAs | | | |

| | Thickness [nm] | Material | Dopant | Type | Carrier Conc. |
|---|---|---|---|---|---|
| n+ Top contact | 150 | 10 ML InAs/ 10 ML GaSb 25 periods | Si-Te | n+ | 1e18 |
| Barrier | 100 | $Al_{0.2}GaSb$ | Be | p+ | 5e17 |
| Active Region | 1940 | 10 ML InAs/ 10 ML GaSb 320 periods | Si-Te | Low n, n.i.d | 6e16 |
| n+ back contact | 150 | 10 ML InAs/ 10 ML GaSb 25 periods | Si-Te | n+ | 1e18 |
| Relaxed UD Buffer | 2000 | GaSb | | | |
| GaAs substrate | 640000 | GaAs | Undoped | | |

1102 (n+ Top contact through n+ back contact)
1104 (GaAs substrate)
1106 (n+ Top contact)
1108 (n+ back contact)

Fig. 11

METHOD OF FABRICATING A MONOLITHIC SENSOR DEVICE FROM A LAYERED STRUCTURE

CROSS REFERENCE TO RELATED APPLICATIONS

This is a National Phase application under 35 U.S.C. § 371 of International Patent Application No. PCT/EP2018/064464 filed Jun. 1, 2018, which claims priority of United Kingdom Patent Application No. GB 1709006.9 filed Jun. 6, 2017. The entire contents of which are hereby incorporated by reference.

FIELD OF THE INVENTION

The invention relates to a method of fabricating a monolithic sensor unit from a layered structure, and may be used to make an array of sensor units. The method may for example be used to fabricate an array of sensor units comprising an InSb-based photodiode integrated with a GaAs-based transistor. The invention has applications in the field of image sensors such as focal plane arrays (FPA).

BACKGROUND

Applications in fields ranging from astronomy to defense and security exploit medium-infrared (mid-IR) imagers. In astronomy, for example, gas plume imaging is of particular interest in the wavelength range between 3 μm and 6 μm, a spectral region in which characteristic absorption lines of many gases lie. Imaging of hydrocarbons can be relevant to industrial asset management, whilst monitoring of greenhouse gases such as carbon dioxide ($CO_2$) and methane ($CH_4$) has potential for environmental applications such as visualisation of plumes escaping from plant and storage wells. However, several hurdles must be overcome before use of mid-IR imaging devices becomes more widespread.

An imaging device such as a focal plane array (FPA) requires each pixel to be read individually. For visible wavelengths, silicon photodiodes (PDs) sensitive in the visible range are monolithically integrated with silicon transistors to achieve individual pixel addressing. For mid-IR detection, suitable photodiode materials include indium antimonide (InSb) and mercury cadmium telluride (known as MCT). However, transistors made on substrates from these materials are not suitable for pixel addressing because they have high leakage currents.

Most commercially available imagers have remedied this problem by implementing the mid-IR photodiodes and the transistors for readout on separate chips. The photodiode chips are usually fabricated on InSb or MCT material, whilst the readout integrated circuits (ROICs) are made on complementary metal oxide semiconductor (CMOS) silicon wafers. The silicon wafers are then diced into chips, and subsequently a silicon chip is flipped and connected to the photodiode chip through so-called “indium bumps”. This technique is known as flip-chip bonding. Although this hybridised approach can produce large format and high performance imagers, it has a low yield and high costs due to the additional steps involved (e.g. fabrication of separate photodiode and ROIC chips, fabrication of indium bumps, and alignment of photodiode chip and ROIC chip). Moreover, the reliability of indium bump interconnections can become more and more challenging when the technology is scaled for fabrication of large format arrays.

Another issue of the hybrid approach arises from the fact that most mid-IR imagers are operated under cryogenic cooling. Due to the large thermal expansion mismatch between common mid-IR sensitive materials and the silicon chips, considerable stress is thus experienced by the interconnections during thermal cycles, resulting in the possibility of connection failure or material cracking in the worst case.

Recently, antimonide-based detectors grown on a GaAs substrate demonstrated comparable performance to devices grown on more expensive InSb or GaSb materials. The underlying GaAs provides a cost-saving substrate, and can also provide a functional layer for metal-semiconductor field-effect transistors (MESFETs) and metal-insulator-semiconductor field-effect transistors (MISFETs).

SUMMARY OF THE INVENTION

In general terms, the present disclosure provides a method of fabricating a field-effect transistor in a highly repeatable manner, which can enable fabrication of an array of such devices with high uniformity of response across the array. The method of the invention achieves the high uniformity of response by removing a native oxide layer from the layered structure prior to etching a gate recess of the field-effect transistor. The cleaning step ensures that the etch of the gate recess starts at the same time across an entire sample, such that a uniform gate recess depth and profile can be achieved across an array of field-effect transistors. This results in a highly uniform switch-off voltage for the field-effect transistors in the array.

The method may find particular use where field-effect transistors are to be fabricated together with a sensor in a monolithic sensor unit. For example, the sensor may be a optical sensor (e.g. photodiode), whereby the sensor unit may form a pixel in a imaging array, e.g. a focal plane array.

Thus, according to one aspect of the invention, there is provided a method of fabricating a monolithic sensor unit comprising a sensor and a field-effect transistor formed within a layered semiconductor stack, the layered semiconductor stack having a substrate, a first semiconductor device layer for forming the field-effect transistor deposited on the substrate and a second semiconductor device layer deposited on the first semiconductor device layer, the second semiconductor device layer providing an active region for the sensor, wherein the method includes the steps of: selectively etching a portion of the second semiconductor device layer to expose a surface of the first semiconductor device layer; and performing a wet etch process on a portion of the first semiconductor device layer to form a gate recess in the first semiconductor device layer, wherein the wet etch process comprises: applying a native oxide removal solution to remove native oxide from the exposed surface of the first semiconductor device layer, and applying a gate recess etchant solution to remove material from the first semiconductor device layer and thereby form the gate recess.

The layered semiconductor stack may be structure comprising a plurality of layers deposited or grown in sequence in any known manner, such as molecular beam epitaxy (MBE).

The layered semiconductor stack may include layers (e.g. multilayers) for fabricating the sensor and the field-effect transistor. For example, the first semiconductor device layer and second semiconductor device layer may each include several layers, with the exact structure of the first semiconductor device layer and second semiconductor device layer depending on the type of field-effect transistor and sensor which are to be fabricated, respectively. One or more of the layers in the first and second semiconductor device layers may be made from semiconducting materials. For example, where the sensor is a photodiode, the second semiconductor device layer may include an absorption layer sandwiched between two contact layers. The first semiconductor device layer may for example include a channel layer and a contact layer, e.g. for fabricating a MESFET or a MISFET.

Herein, the term "monolithic" is used to mean that the entire sensor unit (including both the sensor and the field-effect transistor) is fabricated from a single layered semiconductor stack. This is in contrast to prior art configurations where the sensing circuitry and addressing circuitry are contained on different chips. The term "sample" is herein used to describe the sensor unit or array of sensor units at various stages in the fabrication procedure.

The step of selectively etching the second semiconductor device layer may be selectively etched using a wet etch technique. The term "selectively etched" may mean that only a desired portion of the target layer (in this case the second semiconductor device layer) is etched. The wet etch technique may use a first etchant (e.g. in a first etching solution) which etches the second semiconductor device layer but does not etch the first semiconductor device layer. In practice this may be done by selecting a first etchant which has a much higher etch rate for the second semiconductor device layer than for the first semiconductor device layer, such that the etch effectively stops when the first etchant reaches the first semiconductor device layer. This ensures that the exposed surface of the first semiconductor device layer is completely smooth, which is essential for the implementation of a field-effect transistor in this layer.

The portion of the second semiconductor device layer which is etched may be defined using a mask. The mask may for example be a layer of photoresist which is deposited and patterned using conventional photolithographic techniques, where the mask leaves exposed the portion of the second semiconductor layer which is to be etched. Where an array of sensor units is to be fabricated, the portion of the second semiconductor device layer may include an array of regions of the second semiconductor device layer which are to be etched. This array of regions may be defined by the mask.

An advantage of using a wet etch technique for this step is that it avoids damage to the surface of the first semiconductor device layer which may be caused when using alternative dry etch techniques. For example, reactive-ion etching may expose the surface to radio frequency plasma which could damage the surface (e.g. because of ion implantation in the surface) and subsequently affect the functionality of the field-effect transistor.

The step of applying a native oxide removal solution may be for the purpose of cleaning the surface of the first semiconductor device layer. A thin layer of native oxide often forms on the surface of semiconducting materials when they are exposed to atmospheric oxygen. The native oxide layer may prevent or delay the start of an etching process on the first semiconductor device layer, as the native oxide layer can form a barrier between an etchant and the surface of the first semiconductor device layer. This can cause variations in etch rate across the sample, as well as cause the etch to begin at different times in different regions of the sample (e.g. because of variations in thickness of the native oxide layer across the sample). Removing the native oxide layer prior to etching the first semiconductor device layer ensures that etching of the first semiconductor device layer will be uniform across its entire surface.

The native oxide removal solution may be applied to the surface of the first semiconductor device layer by dipping the sample in the native oxide removal solution. The native oxide removal solution may include cleaning agents which are selected to remove the native oxide from the surface of the first semiconductor device layer. An advantage of cleaning the surface of the first semiconductor device layer with a native oxide removal solution is that it avoids damage to the surface which could be caused using dry etch techniques (e.g. reactive ion etching).

The step of applying the gate recess etchant solution may occur immediately after the step of applying the native oxide removal solution. This can ensure that the surface of the first semiconductor device layer is not exposed to air between these steps, to avoid formation of another native oxide layer. This may be done, for example, by first dipping the sample into the native oxide removal solution (sometimes referred to herein as the "cleaning solution") and subsequently dipping the sample into the gate recess etchant solution, without allowing the surface of the sample to dry between the two. The native oxide removal solution may be selected to avoid contaminating the gate recess etchant solution, in order to avoid affecting the quality of the etch. For example, the active agent in the native oxide removal solution may be the same as in the gate recess etchant.

In order to avoid etching the second semiconductor device layer when etching the portion of the first semiconductor device layer, a passivation layer which covers and protects the second semiconductor device layer may be deposited. The portion of the first semiconductor device layer which is etched may be defined using a mask, for example made of a layer of resist which is deposited and patterned using electron-beam lithography. Where an array of sensor units is to be fabricated, the portion of the first semiconductor device layer may include an array of regions of the first semiconductor device layer which are to be etched. This array of regions may be defined by the mask.

The etching of the first semiconductor device layer forms a gate recess in the first semiconductor device layer. The shape of the gate recess is defined by the mask, and may for example be a straight line or a curved line. In some examples, multiple gate recesses may be etched, such that the field-effect transistor of the sensor unit includes multiple gate recesses.

As the native oxide layer has been removed prior to applying the etching solution to the surface of the first semiconductor device layer, etching of the first semiconductor device layer may occur simultaneously and uniformly across the entire sample. For example, where the mask defines an array of regions of the first semiconductor device layer which are to be etched, etching of the first semiconductor device layer may occur simultaneously and uniformly in each region of the first semiconductor device layer. This enables an array of gate recesses to be produced, where the depth and profile of the gate recesses is highly uniform across the entire array. The depth of a gate recess is the step height from the surface of the first semiconductor device layer to a bottom surface of the gate recess. The profile of a gate recess refers to the shape of sidewalls of the gate recess formed in the first semiconductor device layer.

The depth of the gate recess obtained may depend on the duration of the etch (i.e. the longer the surface of the first semiconductor device layer is exposed to the second etching solution, the deeper the gate recess). To stop the etch, the sample may be removed from the second etching solution and rinsed using a rinsing solution (e.g. de-ionised water).

As the switch-off voltage of a field-effect transistor may depend on the depth and profile of its gate recess, a highly uniform recess gate depth and profile across an array enables an array of field-effect transistors having a highly uniform switch-off voltage to be produced. An array of sensor units fabricated according to the method of the invention may therefore have a substantially uniform voltage response, enabling production of large sensor arrays. Herein the term "switch-off voltage" refers to a bias voltage which must be applied to a gate electrode of a field-effect transistor in order to switch the field-effect transistor to an "off" state (i.e. a state where a conductive channel between source and drain electrodes of the field-effect transistor is pinched off, such that current flow between the source and drain electrodes is effectively prevented).

Following the etching of the gate recess, the gate electrode is deposited in the gate recess. In some embodiments of the invention, deposition of the gate electrode may be preceded by deposition of a thin (e.g. few nm) insulating dielectric layer. This dielectric layer may for example be silicon nitride, silicon dioxide, or another suitable dielectric. The dielectric layer may be used to reduce the leakage current passing through the gate electrode (i.e. the unwanted current flowing through the device when it is in the "off" state) by implementing a MISFET. Deposition of the dielectric layer may happen by means of sputtering, inductively coupled plasma (ICP) dielectric deposition, or other suitable technique for deposition of thin insulating films. If a thin insulating film is deposited to implement a MISFET, the gate electrode is deposited on top of the insulating film in the gate recess, without the need for additional lithographic steps. The gate electrode may be deposited using conventional metal evaporation and patterned lift-off techniques. The gate electrode may be formed of stacked metallic layers in order to provide a low contact resistance and good adhesion to the bottom surface of the gate recess or to the insulating dielectric layer.

The wet etch process may include applying a surface active agent solution to the exposed surface of the first semiconductor device layer. The surface active agent solution may be a mixture of anionic and non-ionic surface active agents (also known as "surfactants"), stabilising agents, alkalis, non-phosphate detergent builders and sequestering agents. The surface active agent solution serves to lower the surface tension between the surface of the first semiconductor device layer and the cleaning solution, in order to improve the wettability of the surface of the first semiconductor device layer. This may help the cleaning agent penetrate intricate microstructures (e.g. trenches and vias) as well as enhance the cleaning solution's effectiveness, so that the native oxide layer may be efficiently removed from the surface of first semiconductor device layer. This in turn enhances the uniformity of the etch of the gate recess, as it helps prevent residual native oxide being left on the surface of the first semiconductor device layer after the cleaning step. Use of a surface active agent solution in the cleaning step may therefore improve the uniformity of response across an array of sensor units.

The step of applying the surface active agent solution may occur immediately before the step of applying the native oxide removal solution. Alternatively or additionally, a surface active agent solution may be included in the native oxide removal solution. In some examples, the method includes applying a surface active agent solution to the first semiconductor device layer, and then applying a mixture of native oxide removal solution and surface active agent solution to the surface of the first semiconductor device layer. This may serve to further enhance the action of the cleaning solution.

Herein, the term "surface active agent" refers to a chemical compound that lowers the surface tension between a liquid and a surface, in order to improve the wettability of that surface. The term "wettability" (also known as "wetting") refers to the ability of a surface to be wet by a liquid, and relates to a contact angle between the liquid and the surface.

The wet etch process may be performed repeatedly to obtain a gate recess having a predetermined depth. For example, the steps of the wet etch process discussed above may be performed as an ordered sequence. This sequence can be repeated until a gate recess of desired depth is obtained. As noted above, the depth of the gate recess depends on the duration of the etch. Thus, by iteratively repeating the sequence of cleaning and etching steps, the depth of the gate recess may be incrementally increased, until a desired depth is obtained. By controlling the depth of the gate recess in this manner, the switch-off voltage of the field-effect transistor may be set to a desired level.

As noted above, the gate recess etch may be stopped by rinsing the surface of the first semiconductor device layer with a rinsing solution. The sequence of steps may thus include a rinsing step. At the end of each sequence of steps, the depth of the gate recess may be measured or estimated, in order to determine whether the predetermined gate recess depth has been obtained. For example, the depth of the gate recess may be measured using a profilometer. Alternatively, the depth of the gate recess may be estimated based on a measurement of a current flow between a source electrode and drain electrode of the field-effect transistor (deposition of source and drain electrodes is described below) at an applied bias voltage. This can be done for example using a probe station to source a current between the source and drain electrodes whilst applying a bias voltage to the gate recess.

An advantage of repeating the whole sequence of steps (rather than just the etching step) is that the uniformity of the etching process can be maintained over several iterations, thus providing an etch with a similar etch rate each time. This may facilitate fine-tuning of the gate recess depth (and hence the switch-off voltage of the field-effect transistor).

The layered semiconductor stack may include a buffer layer between the first semiconductor device layer and the second semiconductor device layer. The material of the buffer layer may be selected to relax strain arising from a lattice mismatch between the first semiconductor device layer and the second semiconductor device layer. The buffer layer may thus serve to improve the structural integrity of the sensor unit, and avoid cracks or breakages from occurring in the sensor unit.

In the case where there is a buffer layer, it may also be necessary to selectively etch a portion of the buffer layer in order to expose the surface of the first semiconductor device layer. Depending on the material of the buffer layer, the first etching solution may also provide selective etching of the buffer layer.

In one example, the sensor is a photodiode sensitive to radiation in the mid-infrared region. For example, the active region of the second semiconductor device layer may comprise InSb. In this example, the layered semiconductor stack may include a GaSb buffer layer between the first semiconductor device layer and the second semiconductor device layer. The step of selectively etching a portion of the second semiconductor device layer may include applying a buffer etchant solution for removing the GaSb buffer layer to expose the surface of the first semiconductor device layer. The buffer etchant solution may comprise tetramethylammonium hydroxide. This solution may be particular advantageous if the first semiconductor device layer comprises a GaAs channel layer for the field-effect transistor, because this buffer etchant solution has substantially no etching effect on GaAs.

Thus, in a particular embodiment, the method of the invention may be used to fabricate a GaAs-based field-effect transistor on which an InSb-based photodiode may be implemented. The method of the invention thus enables sensor arrays (e.g. FPAs) for detection of mid-IR radiation to be fabricated on a single chip, without the need for bonding to a second CMOS chip for pixel addressing. This can greatly simplify the fabrication process for mid-IR sensor arrays, as well as facilitate the scaling-up in size of sensor arrays.

Returning to a more general discussion of the method disclosed herein, a source electrode and a drain electrode may be formed on the surface of the first semiconductor device layer to form a source electrode and drain electrode of the field-effect transistor, respectively. The source electrode and the drain electrode can be arranged such that a current between the source electrode and the drain electrode is controllable based on a bias voltage applied to the gate electrode.

The source electrode and a drain electrode may be formed prior to etching the gate recess, so that the source and drain electrodes may be used to monitor the depth of the gate recess, as described above. The source and drain electrodes may be deposited using conventional metal evaporation and patterned lift-off techniques. The source and drain electrodes may be formed of stacked metallic layers in order to provide a low contact resistance and good adhesion to the surface of the first semiconductor device layer.

In certain embodiments, the second semiconductor device layer may include a first contact layer, an absorption layer deposited on the first contact layer and a second contact layer deposited on the active layer, and the method may further include the steps of: etching a portion of the second semiconductor device layer to expose a surface of the first contact layer; depositing a first sensor electrode on the surface of the first contact layer; and depositing a second sensor electrode on the second contact layer. The second semiconductor layer may thus be used to fabricate a photodiode. The second sensor electrode may be deposited on the second contact layer before the etching of the second semiconductor device layer. For large size, e.g. single pixel devices, the first sensor electrode and the second sensor electrode may be deposited together in a single metallization step. Other layers may also be included in the second semiconductor device layer, such as a barrier layer disposed between the second contact layer and the absorption layer which may serve to reduce dark current. The portion of the second semiconductor device layer may be etched using a wet etch technique. The wet etch technique may use an etching solution similar to the first etching solution mentioned above. The etch may be timed so that layers above the first contact layer are etched until the surface of the first contact layer is exposed. The portion of the second semiconductor device layer to be etched may be defined using a mask, e.g. made of patterned photoresist.

The first and second sensor electrodes may be deposited using conventional metal evaporation and patterned lift-off techniques. The first and second contact electrodes may be formed of stacked metallic layers in order to provide a low contact resistance and good adhesion to the surface of the first semiconductor device layer. The first and second sensor electrodes may be used to obtain a sensor reading (e.g. voltage or current) from the sensor.

The method may further include the steps of depositing a planarising section forming a ramp between the first sensor electrode and the drain electrode; and depositing an interconnection on the planarising section to electrically connect the first sensor electrode to the drain electrode. The planarising section serves to avoid breaks from forming in the interconnection, which may arise due to large steps in the structure of the sensor unit. The interconnection may be deposited using conventional metal evaporation and patterned lift-off techniques. The metal interconnection serves to connect the sensor and field-effect transistor in series, so that the field-effect transistor may be used to control whether a reading can be obtained from the sensor.

The layered semiconductor stack may include a common contact layer for the first semiconductor device layer and the second semiconductor device layer. In such examples, the method may include: depositing a first contact electrode on the surface of the first semiconductor device layer; and depositing a second contact electrode on a surface of the second semiconductor device layer, wherein the first contact electrode and the second contact electrode are arranged such that a current between the first contact electrode and the second contact electrode is controllable based on a bias voltage applied to the gate electrode. In this case, there is no need for any interconnection to be deposited, as the sensor and field-effect transistor are connected directly through the common contact layer. As a result, the sensor unit need include only three electrodes (i.e. the first and second contact electrodes and the gate electrode). This can reduce the number of fabrication steps required to fabricate the sensor unit. It can also increase the amount of available sensing area on the second semiconductor device layer, so that the "fill-factor" (i.e. the ratio between the available sensing area and overall area of the sensor unit including the opaque electrodes) is maximised.

As discussed above, the method disclosed herein may be applied simultaneously at a plurality of locations on a common substrate to form an array of sensor units. In this case, the steps described herein may be carried out for each sensor unit in the array. Conventional metal deposition and lithographic techniques (e.g. photolithography and e-beam lithography) enable the steps described herein to be scaled up to fabricate an array of sensor units. The method of the invention may thus be used to fabricate an array of sensor units having a highly uniform response across the array. This enables large, high-resolution, sensor unit arrays to be fabricated.

According to another aspect of the invention, there is provided a monolithic sensor unit having a sensor integrated with a field-effect transistor, the sensor unit having a layered semiconductor stack comprising: a substrate; a first semiconductor device layer forming the field-effect transistor deposited on the substrate; a second semiconductor device layer deposited on the first semiconductor device layer, the second semiconductor device layer providing an active region for the sensor; a common contact layer disposed between the first semiconductor device layer and the second semiconductor device layer; a first contact electrode deposited on a surface of the first semiconductor device layer; a second contact electrode deposited on a surface of the second semiconductor device layer; and a gate electrode for the field-effect transistor disposed in a gate recess formed in the first semiconductor device layer, wherein the field-effect transistor is arranged to control, based on a bias voltage applied to the gate electrode, a current flowing between the first contact electrode and the second contact electrode. The monolithic sensor unit of this aspect may be fabricated according to the method of the first aspect of the invention. Accordingly, features of the first aspect of the invention may be shared with this aspect and are not discussed again.

Advantageously, the sensor unit of this aspect of the invention does not require any interconnection to be deposited between the sensor and the field-effect transistor, as the sensor and field-effect transistor are connected directly through the common contact layer. As a result, the sensor unit need include only three electrodes (i.e. the first and second contact electrodes and the gate electrode). This can reduce the number of fabrication steps required to fabricate the sensor unit. It can also increase the amount of available sensing area on the second semiconductor device layer.

The layered semiconductor stack may include a buffer layer for relaxing strain arising from a lattice mismatch between the first semiconductor device layer and the second semiconductor device layer. In some examples, the buffer layer may have a dual functionality. For example, if the sensor is an avalanche photodiode, the buffer layer may enable charge carrier multiplication in the avalanche photodiode. For example, the photodiode may comprise an absorption region of InSb, and the buffer layer may comprise GaSb. The first semiconductor device layer may comprise a GaAs channel layer for the field-effect transistor.

The fabrication steps described herein may all be performed at temperatures below 200° C. This may make the method suitable for application to stacked semiconductor device layers grown at low temperatures (i.e. equal to or less than 400° C.).

BRIEF DESCRIPTION OF THE DRAWINGS

Examples of the invention are discussed below with reference to the accompanying drawings, in which:

FIG. 9 is a table showing example layers which may form the monolithic sensor unit illustrated in FIG. 7;

FIG. 11 is a table showing an example structure of a photodiode which may be grown on a GaAs-based field-effect transistor according to the invention;

DETAILED DESCRIPTION

Figure 1:
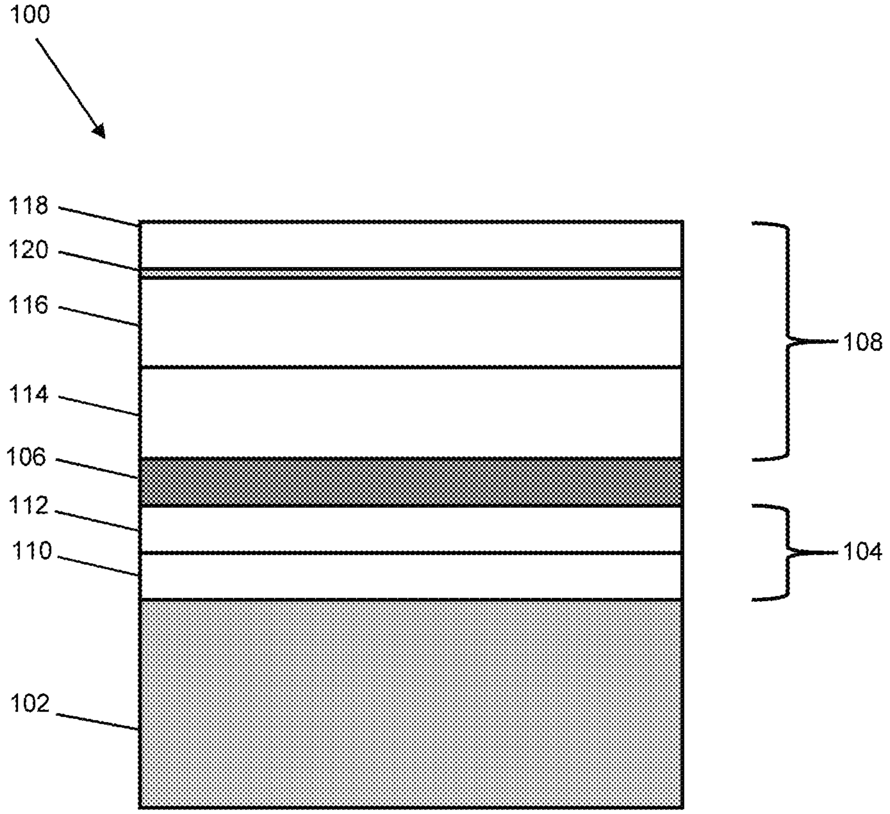
FIG. 1 is a schematic cross-sectional view of a layered structure which can be used to fabricate a monolithic sensor unit according to the method of the invention.

FIG. 1 is a schematic cross-sectional view illustrating a layered structure 100 which can be used to fabricate a monolithic sensor unit using the method of the present invention. The layered structure 100 may be grown using conventional techniques, such as molecular beam epitaxy (MBE). The layered structure 100 is designed for implementation of a sensor unit having a GaAs-based transistor for individual pixel addressing integrated with an InSb-based PD for mid-IR detection. Using the fabrication method of the invention, multiple sensor units can be fabricated on the same substrate to form a pixel array (with each sensor unit forming a pixel). Moreover, the method of the invention enables improved uniformity of performance across multiple sensor units, such that a large pixel array having a uniform response across the array can be produced.

The layered structure 100 includes a substrate 102 which may be made of semi-insulating GaAs. Deposited on the substrate 102 is a first semiconductor device layer 104 for forming a field-effect transistor. Deposited on the first semiconductor device layer 104 is a buffer layer 106, and deposited on the buffer layer 106 is a second semiconductor device layer 108 for forming a photodiode.

The first semiconductor device layer 104 includes a channel layer 110. The channel layer 110 may be a 200 nm thick layer made of n-doped GaAs having a donor density $N_D=1\times10^{17}$ $cm^{-3}$. Deposited on top of the channel layer 110 is a contact layer 112. The contact layer 112 may be a 300 nm thick heavily n-doped GaAs layer with $N_D=2\times10^{18}$ $cm^{-3}$. The first semiconductor device layer 104 may thus be used to form a GaAs-based metal-semiconductor field-effect transistor (MESFET) or a metal-insulator-semiconductor field-effect transistor (MESFET).

The second semiconductor device layer 108 includes a first contact layer 114 deposited on the buffer layer 106. The first contact layer 114 may be a 3000 nm thick layer made of n-doped InSb. Deposited on the first contact layer 114 is an absorption layer 116 (also sometimes referred to as an "active layer"). The absorption layer 116 may be a 2500 nm thick layer of substantially undoped (i.e. not intentionally doped) InSb. In some examples, the InSb may be lightly doped to compensate for so-called background doping.

Deposited on top of the absorption layer 116 is a second contact layer 118. The second contact layer may be a 500 nm thick layer of p-doped InSb. Optionally, there may also be a thin barrier layer 120 disposed between the absorption layer and second contact layer 118. The barrier layer 120 may serve to block electron flow between the absorption layer 116 and the second contact layer 118, for example in cases where the absorption layer 116 is unintentionally doped. This can help reduce the dark current, and allow photodiode operation at higher temperature. The barrier layer 120 may be a 20 nm thick layer of $In_{0.15}Al_{0.85}Sb$. The second semiconductor device layer 108 may thus be used to form an InSb-based PD.

The buffer layer 106 may be a 300 nm thick layer made of undoped GaSb. The buffer layer 106 serves to allow relaxation of any strain which may be introduced by a lattice mismatch between the first semiconductor device layer 104 and the second semiconductor device layer 108. In the case of GaAs and InSb, there is a large lattice mismatch of around 14.6%.

Other layers may also be included in the layered structure 100. For example, there may be a substrate buffer layer (not shown) between the first semiconductor device layer 104 and the substrate 102. In this case, the channel layer 110 may be deposited on substrate buffer layer rather than directly on the substrate 102. The substrate buffer layer may for example be made of undoped GaAs. An additional layer buffer (not shown) may be provided between the first semiconductor layer 104 and the buffer layer 106. The additional buffer layer may also be made of undoped GaAs.

It should be noted that layered structures other than that described above in relation to FIG. 1 may be used with the method of the present invention. In particular, the specific materials and the layer thicknesses are given by way of example, and other materials and thicknesses may be used. For example, different materials may be used if different types of PD (e.g. which are sensitive at other wavelength ranges) or different types of transistor are to be implemented.

FIGS. 2A-2D show schematic cross-sectional views of the structure 100 after various steps of the method of the invention have been carried out on the layered structure 100. The steps carried out serve to define a gate recess in the first semiconductor device layer 104, in which a gate electrode can be deposited. The reference numbers in FIGS. 2A-2D are the same as those in FIG. 1 where they relate to the same features.

Figure 2A:
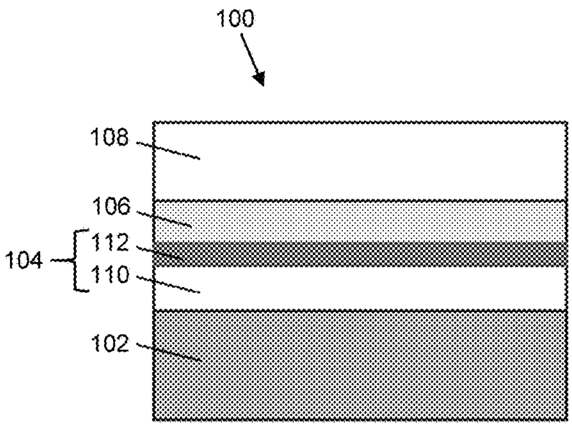
FIGS. 2A-2D are schematic cross-sectional views of the layered structure shown in FIG. 1 at different stages in the method of the invention.
Figure 2B:
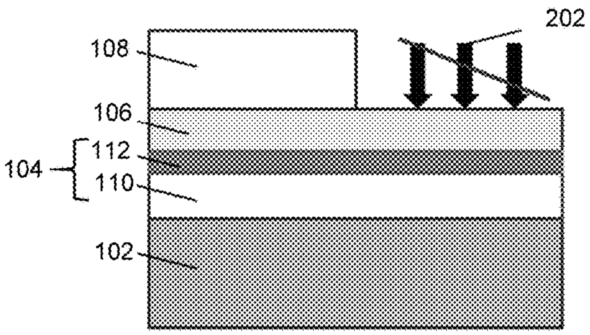

FIG. 2A shows the layered structure 100 described above in relation to FIG. 1. FIG. 2B shows the layered structure 100 after a portion of the second semiconductor device layer 108 was selectively etched to expose a surface of the buffer layer 106. To do this, an area of the upper surface of the second semiconductor device layer 108 is masked with photoresist using standard photolithographic techniques, such that the portion to be etched is left exposed. The masked area defines the sensing area of the photodiode. The exposed region can be etched using a citric acid and hydrogen peroxide based wet chemical etching process. This etching process selectively etches the InSb-based second semiconductor device layer 108, such that the etch effectively stops at the GaSb-based buffer layer, as indicated by crossed arrows 202. Indeed, with this etch process, InSb has an etch rate of around 20 nm/min, whilst GaSb has an etch rate of around 0.6 nm/min.

Figure 2C:
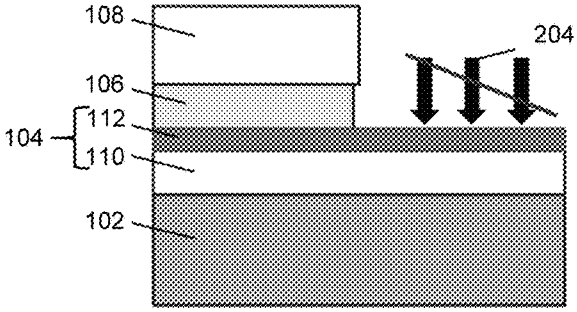

Following the selective etching of the second semiconductor device layer 108, the buffer layer 106 is then selectively etched. The result of this second etch is shown in FIG. 2C, where a portion of the buffer layer 106 has been removed to expose a top surface of the contact layer 112. The GaSb-based buffer layer may be selectively etched using a solution of tetramethylammonium hydroxide (TMAH), for example a solution of 2.5% TMAH. TMAH does not etch the GaAs-based contact layer 112, such that the TMAH-based etch effectively stops at the top surface of the contact layer 112 (as indicated by crossed arrows 204). A perfectly smooth surface of the contact layer 112 can thus be exposed. Other wet etching solutions suitable for etching GaSb do not stop at the underlying GaAs and can hinder the subsequent MESFET fabrication, which needs to start from a perfectly planar GaAs surface. Alternative GaSb dry etching processes can cause exposure of the underlying GaAs to damaging radio frequency plasma and affect the MESFET switching performance, thus jeopardising array functionality. The TMAH-based GaSb wet etching process therefore enables selective etching of the buffer layer 106 without adversely affecting the performance of the array.

Figure 2D:
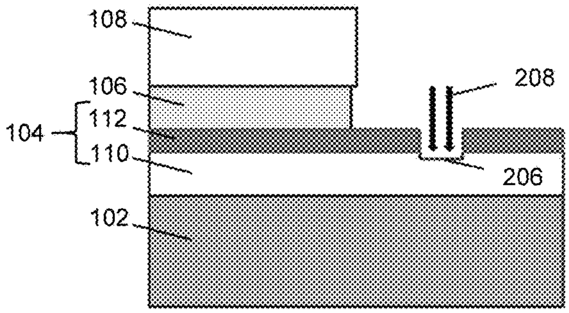

Following the selective etching of the buffer layer 106, a gate recess 206 is etched in the first semiconductor device layer 104, as shown in FIG. 2D. The region of the first semiconductor device layer 104 which is to be etched may be defined by forming a photoresist mask on the exposed surface of the contact layer 112 using conventional photolithographic techniques. Etching of the gate recess 206 is carried out using a combination of cleaning and etching solutions.

In this example, a set of four solutions is used to etch the gate recess 206: (1) a solution of surface active cleaning agent (sometimes known as a surfactant), (2) a solution of native oxide remover and surface active cleaning agent, (3) an etching solution, and (4) a rinsing solution. For example, solution (1) may contain 100 mL of water and 0.1 mL of surface active cleaning agent; solution (2) may contain 100 mL citric acid:$H_2O$ de-oxide solution and 0.1 mL of surface active agent; (3) may contain a solution of 20:1, by volume, citric acid:$H_2O_2$ etchant; and (4) may be de-ionised water. The surface active agent may be a mixture of anionic and non-ionic surface active agents, stabilising agents, alkalis, non-phosphate detergent builders and sequestering agents. A suitable surface active cleaning agent may be, for example, DECON®-90.

In order to etch the gate recess 206, the layered structure shown in FIG. 2C is dipped into each of solutions (1)-(4) in order, without exposing it to air between solutions. Specifically, the layered structure is first dipped into solution (1), then into solution (2), then into solution (3), and then into solution (4). The etching of the gate recess 206 is illustrated by arrows 208.

The mechanisms underlying the etch process for the gate recess 206 are now detailed. When GaAs is exposed to atmospheric oxygen, a non-uniform thin layer of native oxide will rapidly form on its surface. Such a native oxide layer may thus form on the surface of the GaAs-based first semiconductor device layer 104 when it is exposed to air. This layer of native oxide can prevent or delay the start of an etching process on the first semiconductor device layer 104. The native oxide layer can also lead to non-uniform etching of the first semiconductor device layer 104, due to variations in its thickness across a large sample. Variations in etching rate can result in non-uniform gate recess depths and gate recess profiles across an array, which in turn can lead to variations in GaAs MESFET switch-off voltages over the array. Therefore, it is preferable to thoroughly remove the native oxide layer before etching the gate recess.

The surface active agent in solutions (1) and (2) serves to improve the wettability of the surface of the first semiconductor device layer 104 (which in this case is the exposed top surface of the contact layer 112). This helps the native oxide remover in solution (2) to penetrate intricate microstructures (e.g. trenches and vias), so that the native oxide is completely and uniformly removed from the surface of the first semiconductor device layer 104 before etching begins. The native oxide remover in this example is a diluted de-oxidising solution of citric acid and water. An advantage of this native oxide remover is that it does not contaminate the etching solution of citric acid which is used afterwards to carry out the etch. In contrast, diluted acid solutions such as $HCl/H_2O$ which are conventionally used for GaAs native oxide removal may contaminate the etching solution and affect the quality of the etch.

Once the native oxide layer has been uniformly removed from the surface of the first semiconductor device layer 104, the layered structure is exposed to the etching solution (solution (3)). As the surface of the first semiconductor device layer 104 which is exposed to the etching solution is completely smooth and devoid of any native oxide, this ensures that the reaction between the exposed GaAs material and the etching solution is triggered at the same time across the whole surface of the desired gate. The removal of the native oxide layer also enables a uniform etching rate to be achieved across a large surface, providing a well-controlled gate recess etch. The gate recess etch may also be enhanced by the improved wettability of the surface of the first semiconductor device layer, due to its exposure to the surface active agent. Etching of the gate recess 206 is stopped when the layered structure is dipped into the rinsing solution. The gate recess 206 may be formed only in the contact layer 112, or the gate recess may extend into the channel layer 110. By using this gate recess etch technique, an array of MESFETs having highly uniform gate recesses (and hence switch-off voltages) can be produced.

The depth of the gate recess 206 may be controlled by carrying out an iterative etching process where the dipping sequence described above is repeated until a desired depth of the gate recess 206 is obtained. This may be done for example by using a probe station to measure a current between source and drain electrodes deposited on the contact layer 112 (source and drain electrodes are described below in relation to FIGS. 3A-3C) at the end of a dipping sequence. The current which can flow between the source and drain electrodes at an applied bias voltage is related to the depth of the gate recess. In this manner, a desired gate recess depth may be achieved by monitoring the current flow at the end of each dipping sequence. For example, the dipping sequence may be repeated until the measured current saturates at a predetermined value at a particular bias voltage.

Additionally, an etch stop layer (e.g. made of AlAs) which is not etched by the etching solution may be included in the first semiconductor device layer 104, in order stop the etch at a predetermined depth and help achieve better gate recess etching uniformity. As the switch-off voltage of a MESFET depends on the depth of the gate recess, the switch-off voltage of the MESFET may thus be controlled.

The gate recess etch technique described above can be used for making transistors having a single gate recess or multiple gate recesses. The shape of the gate recesses is not limited to straight lines. For example, the gate recesses may have curved shapes or S-shapes.

It should be noted that different solutions to solutions (1)-(4) described above may be used with the method of the invention. Additionally, it is not always necessary to use four separate solutions. For example, in some cases, it may not be necessary to use solution (1), as the surface active agent in solution (2) may be sufficient to adequately improve the wettability of the contact layer 112.

Figure 3A:
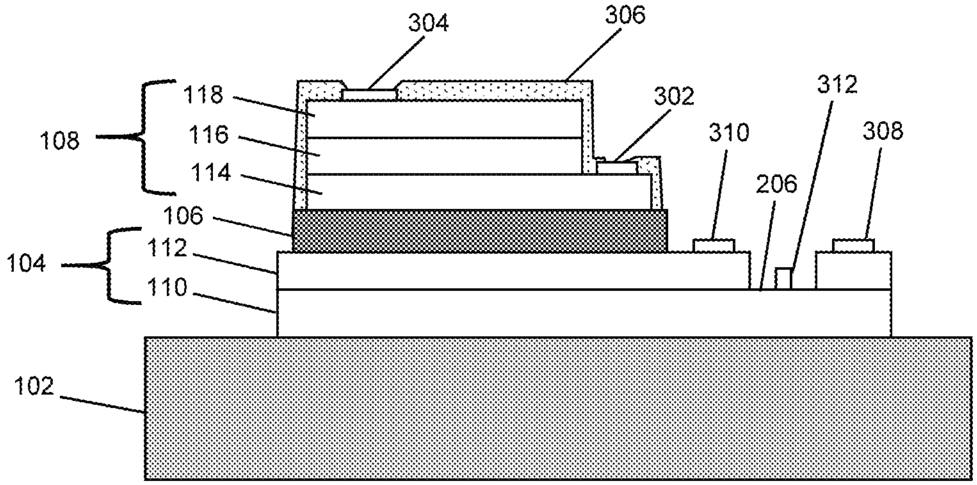
FIGS. 3A-3C are schematic cross-sectional views of a monolithic sensor unit at different stages in the method of the invention.
Figure 3B:
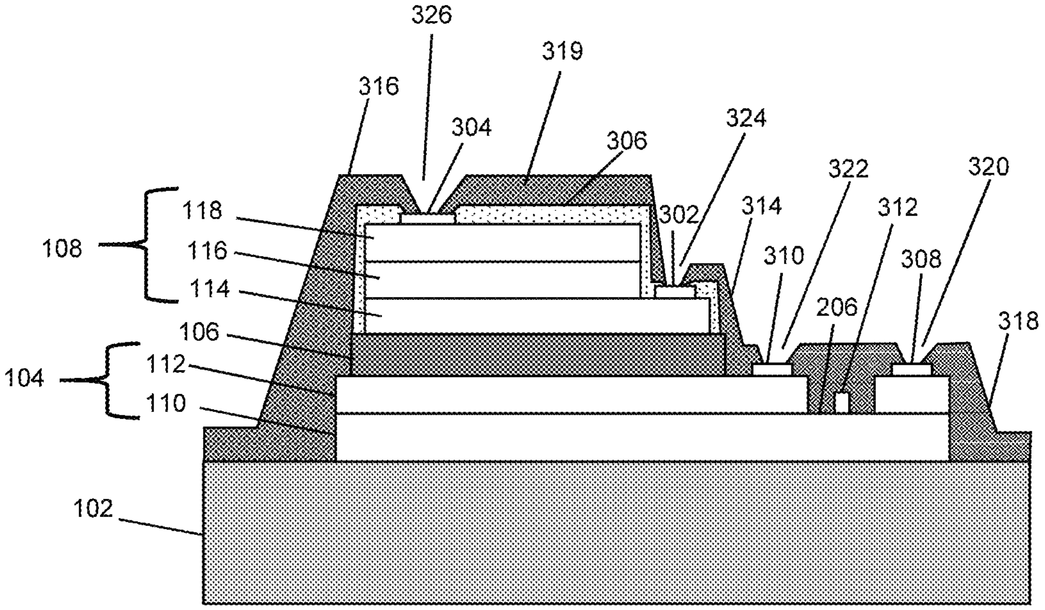
Figure 3C:
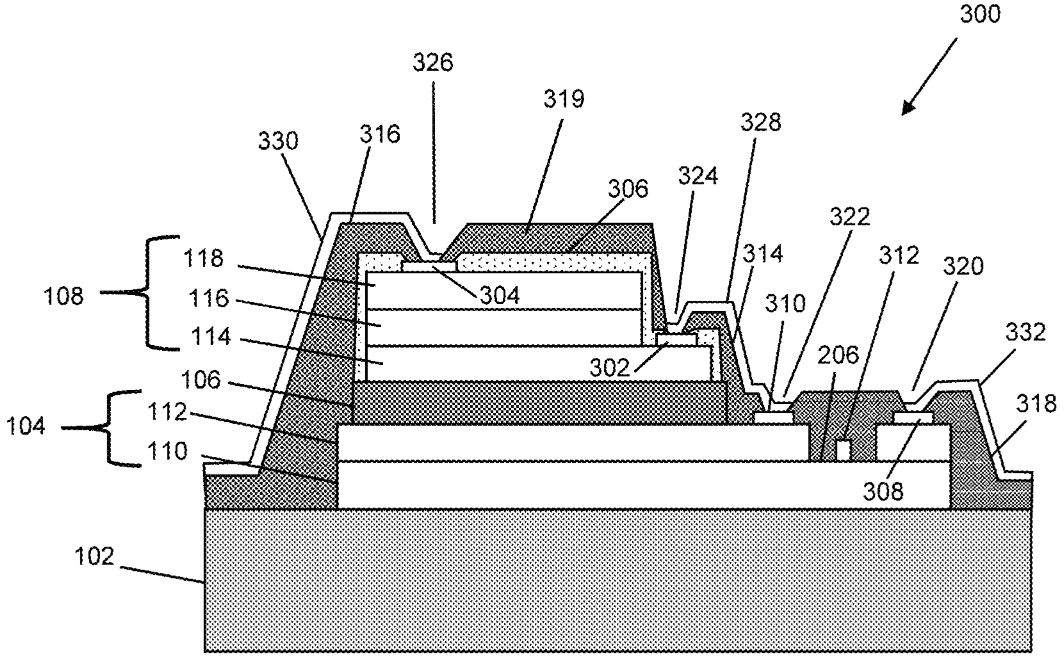

FIGS. 3A-3C show schematic cross-sectional views after various fabrication steps have been carried out on the layered structure 100. A first photodiode electrode 302 is deposited on the first contact layer 114 of the second semiconductor device layer 108, and a second photodiode electrode 304 is deposited on the second contact layer 118 of the second semiconductor device layer 108. The first and second photodiode electrodes may be deposited using conventional metal evaporation and patterned lift-off techniques. In order to deposit the first photodiode contact 302 on the first contact layer 114, it may be necessary to expose a surface of the first contact layer 114. This can be done by etching a portion of the absorption layer 116 and the second contact layer 118. The first and second photodiode electrodes may for example be composed of a 150 nm thick gold layer on top of a 50 nm thick titanium layer.

The surface of the first contact layer 114 may be exposed using a citric acid and hydrogen peroxide based wet chemical etching process such as the one described above. This etching process etches the InSb-based second semiconductor device layer 108 with an etch rate of approximately 20 nm/min. The wet chemical etching process can be timed so that the sample is taken out of the etching solution once the first contact layer 114 is exposed. The exposure of the first contact layer 114 may be confirmed by measuring the actual etch depth with a stylus profiler.

Formation of the photodiode from the second semiconductor device layer 108 is then completed by depositing a passivation layer 306 covering any exposed surfaces (including sidewalls) of the second semiconductor device layer 108. The passivation layer 306 protects the second semiconductor device layer 108, and serves to reduce dark current in the photodiode. The passivation layer 306 may for example be a layer of silicon nitride ($SiN_x$) deposited by low temperature inductively coupled plasma (ICP) deposition. Via windows giving access to the first and second photodiode electrodes may be opened in the passivation layer 306 using sulphur hexafluoride ($SF_6$) based plasma etching in a reactive ion etching machine. The fabricated photodiode is on top of the buffer layer 106, and includes the remaining portions of the second semiconductor device layer 108, the first and second photodiode electrodes 302, 304 and the passivation layer 306.

Note that the photodiode electrodes 302, 304 and the passivation layer 306 may be deposited prior to etching the buffer layer 106 and the gate recess 206. In this manner, the passivation layer 306 may act as a mask for the buffer layer when the buffer layer 106 is etched. The passivation layer 306 may also protect the photodiode when the gate recess 206 is etched.

Following the etching of the buffer layer 106 which exposes the top surface of the channel layer 112, a source electrode 310 and a drain electrode 308 are deposited on the contact layer 112. The source and drain electrodes 310, 308 may be deposited using conventional metal evaporation and patterned lift-off techniques. In order to obtain a low contact resistance, source and drain electrodes 310, 308 may include stacked layers of palladium, germanium and gold. The source and drain electrodes 310, 308 may be deposited prior to etching the gate recess 206. In this manner, after each dipping sequence for etching the gate recess, the depth of the gate recess may be estimated by measuring a current flowing between the source and drain electrodes 310, 308, as described above.

Once the gate recess 206 has been etched, fabrication of the MESFET is completed by depositing a gate electrode 312 in the gate recess 206. The gate electrode 312 may be deposited using conventional metal evaporation and patterned lift-off techniques, and may for example include stacked layers of titanium, platinum and gold. The fabricated MESFET is on top of the substrate 102, and includes the remaining portions of the first semiconductor device layer 104 and the source and drain electrodes 310, 308.

In order to complete fabrication of the sensor unit, interconnections between the photodiode and the MESFET are fabricated. As can be seen in FIG. 3A, however, after the various etching steps there is significant non-planarity across the device. The device includes many steps (known as "mesa steps") between different levels on the device. The step height from the surface of the substrate 102 to the top of the passivation layer 306 may for example be around 6 μm. This can make the formation of metallic interconnections (i.e. wires) between different parts of the device difficult. For example, metallic interconnections may crack when deposited directly on the structure shown in FIG. 3A, in particular when they cross a large step. This can lead to faulty and/or open connections. In order to facilitate deposition of metallic interconnections, planarising sections are added to the device.

As shown in FIG. 3B, a first planarising section 314 between the first photodiode electrode 302 and the source electrode 310 of the MESFET may be deposited to facilitate connection between these two electrodes. A second planarising section 316 and third planarising section 318 may also be deposited to facilitate connection to the second photodiode electrode 304 and the drain electrode 308, respectively. The planarising sections provide ramps between the different levels of the device on which metallic interconnections may be deposited. The planarising sections may cover any sharp corners created by steps in the device, such that there is a continuous and smooth surface between the different levels of the device. These planarising sections serve to avoid cracks from appearing in any metallic interconnections, to provide more reliable connections.

The planarising sections may be made of a polyimide film 319 (e.g. DuPont® PI-2545). A film of polyimide may be formed over the surface of the device by spin-coating. The film may for example be 2 μm thick. The device may then be baked to partially cure the polyimide film and provide a ramping region at each edge of the mesa steps. The bake may for example be for six minutes on a hotplate set to 150° C. An electron beam lithography or photolithography resist layer (e.g. Poly(methyl methacrylate), or "PMMA") may then be spin-coated onto the device and given a pre-exposure bake. The pre-exposure bake may be done by placing the device on a hotplate set to 150° C. for 14 minutes. The pre-exposure bake further contributes to curing the polyimide film.

Subsequently, the resist layer may be patterned using e-beam lithography to expose regions of the underlying polyimide film where via holes in the polyimide film are to be opened. These regions may be located above the various electrodes, so that the via holes in the polyimide film give access to the electrodes. As the polyimide film is only partially cured, a wet etch (e.g. using Microposit®MF-319 as an etchant) may be used to remove the polyimide layer in regions where it is exposed. This exposes the electrodes underlying the polyimide film. By carefully controlling the etching time, via holes having diameters as small as 10 μm may be opened in the polyimide film. This method of forming via holes using a wet etch may provide via holes having positively sloped sidewalls around their whole circumference (i.e. the height of the sidewall increases away from the centre of the via hole). The positive slope of the sidewalls provides a ramp from the surface of the electrode at the bottom of the via hole to the top surface of the polyimide film, so that metallic interconnections to the electrodes are facilitated. The resist may then be stripped away, and the device can be baked in order to fully cure the polyimide film and further smooth the edges of the via holes. The bake may be in an oven set to 180° C. for two hours.

FIG. 3B shows first, second, third and fourth via holes 320, 322, 324, 326 in the polyimide film 319, which give access to the source electrode 310, drain electrode 308, first photodiode electrode 302 and second photodiode electrode 304, respectively.

Once the planarising sections and via holes are formed, the sensor unit may be completed by depositing interconnections. The interconnections may be deposited using conventional metal evaporation and patterned lift-off techniques. The interconnections may include stacked layers of titanium and gold.

FIG. 3C shows a complete sensor unit 300, including interconnections. A first interconnection 328 connects the first photodiode electrode 302 on the photodiode to the source electrode 310 on the MESFET. A second interconnection 330 is connected at one end to the second photodiode electrode 304 on the photodiode, and may be connected at another end to a ground line (not shown). A third interconnection 332 is connected at one end to the drain electrode 308 on the MESFET, and may be connected at another end to a column addressing line (not shown). As can be seen in FIG. 3C, the planarising sections 314, 316 and 318 serve as ramps between different levels of the device for interconnections 328, 330 and 332, respectively. Additionally, the sidewalls of the via holes 320, 322, 324, 326 serve as ramps to facilitate connection to the various electrodes.

Figure 4A:
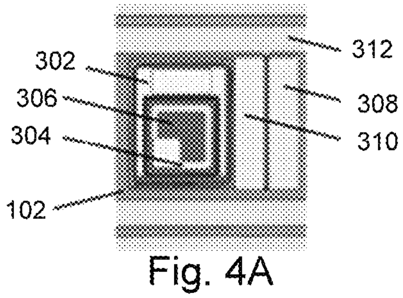
FIGS. 4A-4C are optical micrographs showing a top view of a monolithic sensor unit at fabrication stages corresponding to those illustrated in FIGS. 3A-3C, respectively.
Figure 4B:
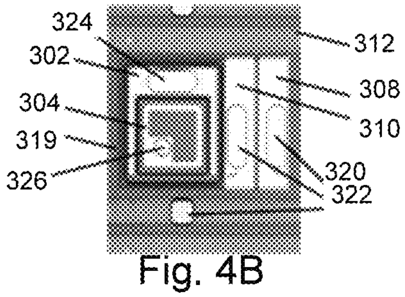
Figure 4C:
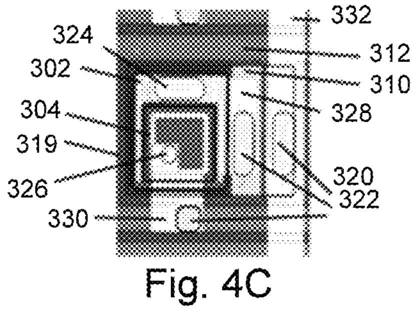

FIGS. 4A, 4B and 4C are optical micrographs showing a top view of a pixel in an array at the stages depicted in FIGS. 3A, 3B and 3C, respectively. The reference numbers in FIGS. 4A-4C are the same as those in FIG. 3A-3C where they relate to the same features, and corresponding features are not described again.

Figure 5A:
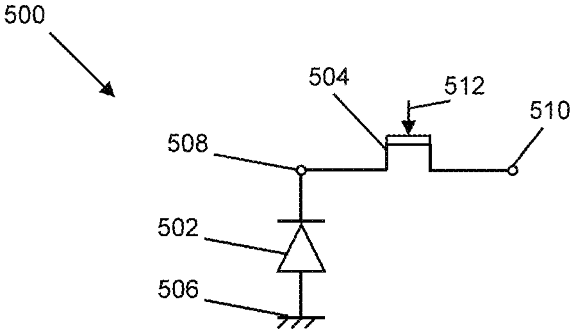
FIG. 5A is an equivalent circuit diagram of the monolithic sensor unit illustrated in FIG. 3C.

FIG. 5A shows an equivalent circuit diagram 500 of the sensor unit 300. The sensor unit includes a photodiode 502 connected in series with a field-effect transistor 504. One terminal of the photodiode 502 is connected to a ground line 506 (e.g. via interconnection 330), and another terminal of the photodiode 502 is connected to a source electrode 508 of the field-effect transistor 504 (e.g. via interconnection 328). The field-effect transistor 504 also includes a drain electrode 510 and a gate electrode 512. A bias voltage applied to the gate electrode 512 can be used to control a current flowing between the source electrode 508 and drain electrode 510. The field-effect transistor 504 controls access to the photodiode 502, and can be used to individually address the sensor unit 300.

When a first bias voltage (e.g. −3.5 V) is applied to the gate electrode 512, the field-effect transistor 504 is in an "off" state, and current cannot flow between the source electrode 508 and the drain electrode 510, and thus the current will not reach the column reading line connected to the drain electrode. When a second bias voltage (e.g. 0 V) is applied to the gate electrode, the field-effect transistor is in an "on" state, and current may flow between the source electrode 508 and the drain electrode 510, and thus reach the column reading line connected to the drain electrode. Thus, when the field-effect transistor 504 is in an "on" state, a photocurrent from the photodiode 502 can be obtained.

Figure 5B:
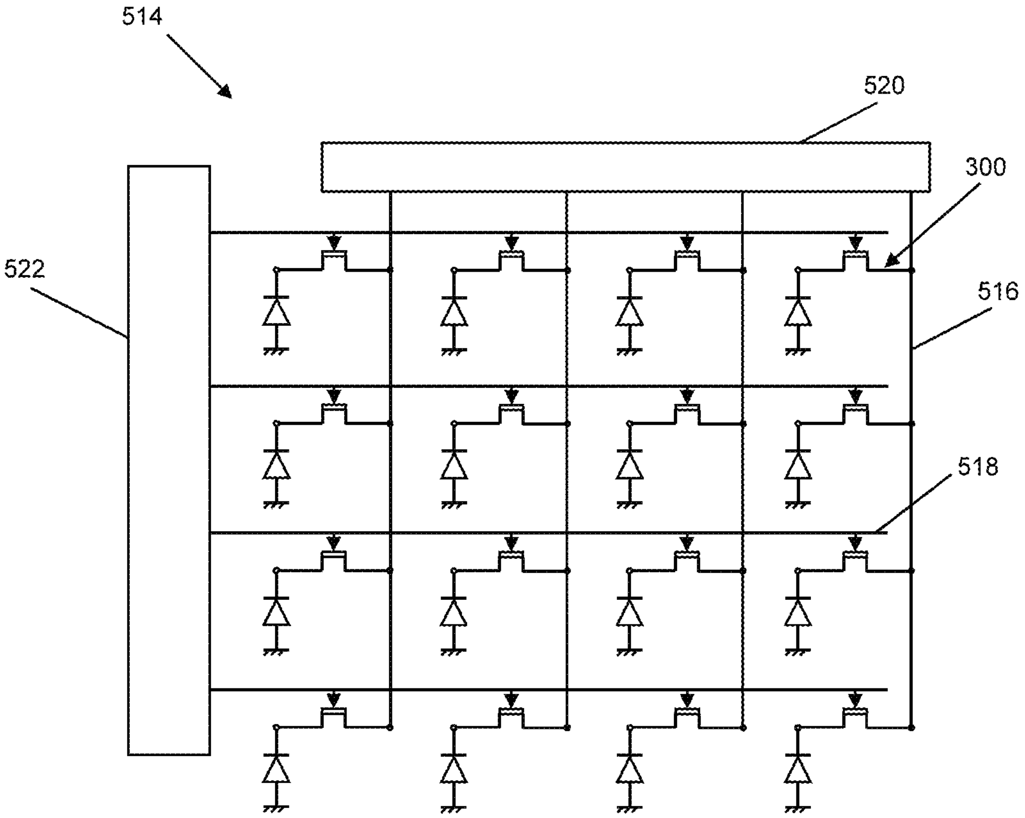
FIG. 5B is an equivalent circuit diagram of an array of sensor units fabricated according to the method of the invention.

FIG. 5B shows an equivalent circuit diagram of a pixel array 514, where each pixel is formed of a single sensor unit 300. The example shown in FIG. 5B is a 4×4 pixel array, however other sizes of array may also be used. The sensor units 300 are arranged in rows and columns. The sensor units 300 may all be fabricated together using the methods described above, starting from a single layered structure 100. In this manner, the array of sensor units is formed on a single chip, which includes both the sensors (i.e. photodiodes) and the field-effect transistors for individual pixel addressing. As discussed above, the method of the invention enables large pixel arrays having highly uniform gate recesses across the whole array (and hence uniform response across the array) to be fabricated.

The drain electrode 510 of each sensor unit 300 in a particular column is connected to a column addressing line 516, with each column having its respective column addressing line. The gate electrode 512 of each sensor unit 300 in a particular row is connected to a row addressing line 518, with each row having its respective row addressing line. A column multiplexer 520 is connected to the column addressing lines 516, and a row decoder 522 is connected to the row addressing lines. The column multiplexer 520 and row decoder 522 may be mounted on a printed circuit board (PCB) which is wire-bonded to the chip containing the sensor units 300.

The column multiplexer 520 and row decoder may be configured to allow readout from individual pixels. For example, the row decoder 522 may select a row of pixels by applying a voltage to a row addressing line 518 to switch all of the field-effect transistors of the pixels in that row to an "on" state. Then the column multiplexer 520 may sequentially read a photocurrent from each pixel in that row by selecting each column addressing line in turn. This procedure can be repeated for each row in the array, such that a photocurrent may be read from each individual pixel in the pixel array 514. A transimpedance amplifier (TIA) may be used to convert the photocurrent output obtained from each of the pixels into a voltage output. More complex addressing methods, for example multiple layers of multiplexing employing several multiplexers and row decoders, may be used for large format arrays. For example, each column may have its own TIA. Photocurrents obtained from a selected whole row of pixels may firstly be transferred into voltage signals and then be selectively readout through the multiplexer.

Figure 6A:
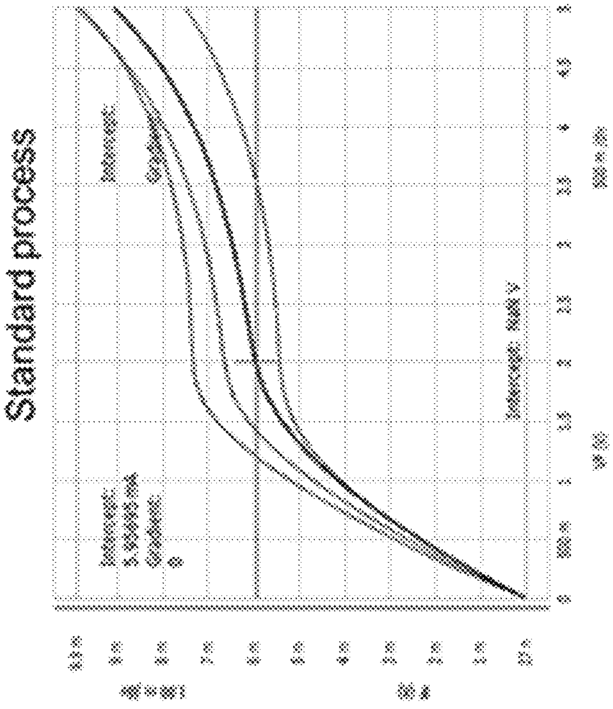
FIG. 6A is a graph showing I-V characteristics for five MESFETs in an array fabricated using conventional fabrication methods.
Figure 6B:
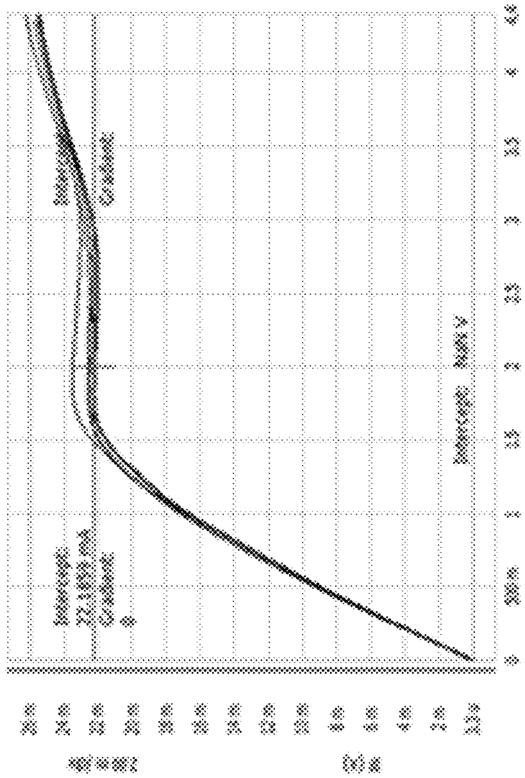
FIG. 6B is a graph showing I-V characteristics for five MESFETs in an array fabricated using the method of the invention.

FIGS. 6A and 6B are graphs of MESFET I-V characteristics showing drain current I as a function of voltage $V_{DS}$ applied between drain and source electrodes, whilst the voltage between gate and source electrodes $V_{GS}$ is kept at 0 V, for two different pixel arrays. FIG. 6A shows I-V characteristics for five MESFETs in a first pixel array, each located at different positions in the array. The pixels in the first pixel array were not fabricated using the fabrication method of the invention. In particular, the gate recess was not etched using the sequence of solutions described above, and no surface active agent was used to improve the wettability of the contact layer 112 prior to etching.

FIG. 6B shows I-V characteristics for five MESFETs in a second pixel array, each located at different positions in the array. The pixels in the second pixel array were fabricated using the fabrication method of the invention. As can be seen by comparing the I-V characteristics in FIGS. 6A and 6B, there is less variation between the response of the MESFETs in the second pixel array compared to the first pixel array. Moreover, the response of the MESFETs in the second pixel array remains highly uniform over a large voltage range. The MESFETs in the second pixel array therefore show a more uniform response than those in the first pixel array. This illustrates the improvement in uniformity of response of the MESFETs using the fabrication method of the invention.

Figure 7A:
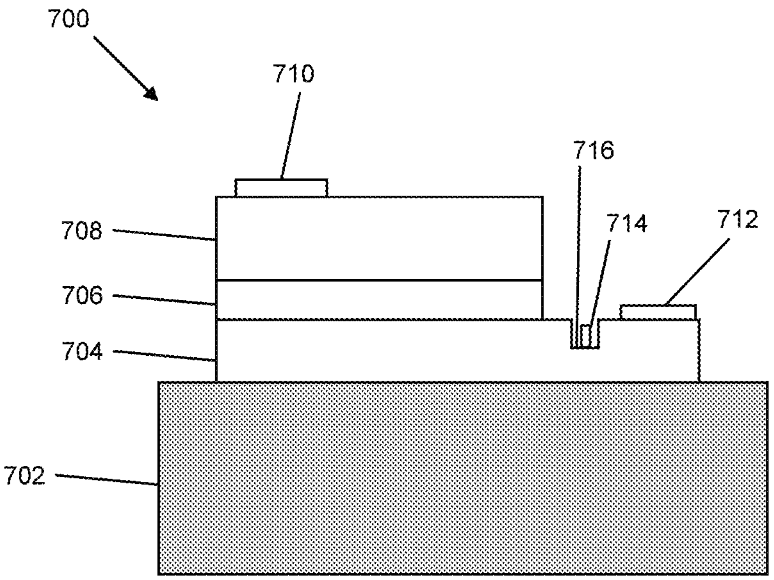
FIGS. 7A and 7B are schematic cross-sectional views of examples of monolithic sensor unit comprising a MESFET and MISFET respectively, which may be fabricated using the method of the invention.
Figure 7B:
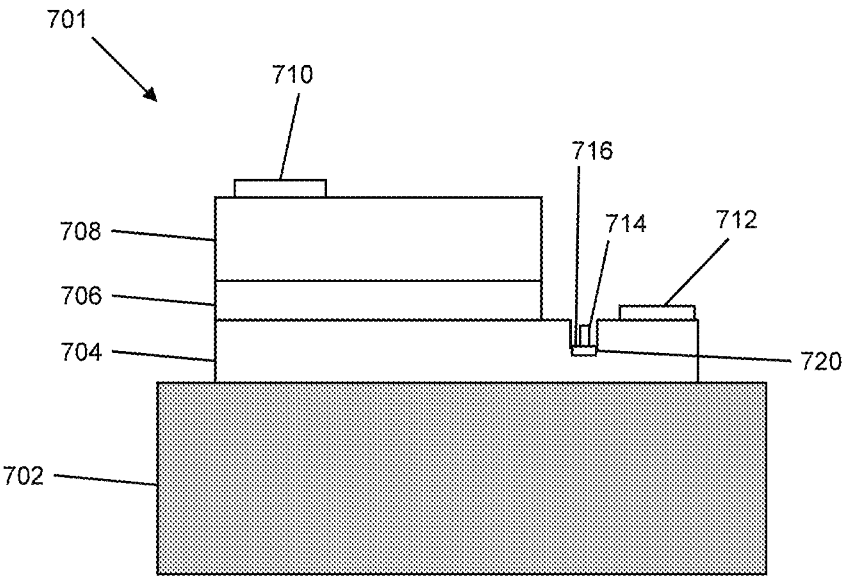

FIGS. 7A and 7B are schematic cross-sectional views of sensor units which may be fabricated using the method of the invention. FIG. 7A shows a sensor unit 700 based on a MESFET, while FIG. 7B shows a sensor unit 701 based on a MISFET. In both sensor units 700, 701, the photodiode and field-effect transistor share a common contact layer, such that interconnection between the photodiode and field-effect transistor occurs through the shared contact layer, and does not require deposition of any additional interconnection.

The sensor unit 700 includes a substrate 702, a first semiconductor device layer 704, a common contact layer 706 deposited on the first semiconductor device layer 704, and a second semiconductor device layer 708 deposited on the common contact layer 706. The first semiconductor device layer 704 together with the common contact layer 706 forms a field-effect transistor, whilst the second semiconductor device layer 708 together with the common contact layer forms a photodiode. The common contact layer 706 therefore acts as a contact layer for both the field-effect transistor and the photodiode, as well as an interconnection between the two. Deposited on the top surface of the second semiconductor device layer 708 is a first contact electrode 710. A second contact electrode 712 is deposited on an exposed surface of the first semiconductor device layer 704. A gate electrode 714 is deposited in a gate recess 716 in the first semiconductor device layer 704. The gate electrode 714 is arranged such that a bias voltage applied to the gate electrode 714 may be used to control a current flowing between the first contact electrode 710 and the second contact electrode 712.

The sensor unit 700 therefore behaves similarly to sensor unit 300 described above (i.e. it has the same equivalent circuit, shown in FIG. 5A), the main difference being that the connection between the photodiode and the field-effect transistor is through the common contact layer 706 rather than through a deposited interconnection. As a result, at least one mask step and one metallisation step may be avoided. Additionally, as only one metallic contact needs to be deposited on the photodiode (i.e. first contact electrode 710), the amount of useable photosensitive area of the photodiode may be larger. This enables pixels to be scaled down to a smaller pitch and the fill factor (i.e. the size of photodiode sensing area divided by the pixel pitch) to be increased. This enables implementation of larger format arrays with higher sensitivity. Similar selective etching processes to those described above may be used to etch portions of the second semiconductor device layer 708 and the common contact layer 706, and for etching the gate recess 716 in the first semiconductor device layer 704.

FIG. 7B is a cross-sectional view of the monolithic sensor unit 701, which is analogous to the sensor unit 700 with the exception that in the gate recess 716 a thin film of dielectric 720 is deposited prior to deposition of the gate electrode 714. The field-effect transistor is thus a MISFET rather than a MESFET, and the presence of the dielectric layer between the gate electrode and semiconductor device layer 704 allows the gate leakage current (i.e. the unwanted current flowing through the transistor when it is in the "off" state) to be reduced.

FIGS. 8A, 8B, 8C and 8D illustrate the increase in size of the sensing area of the photodiode which can be achieved using the structures shown in FIGS. 7A and 7B.

Figure 8A:
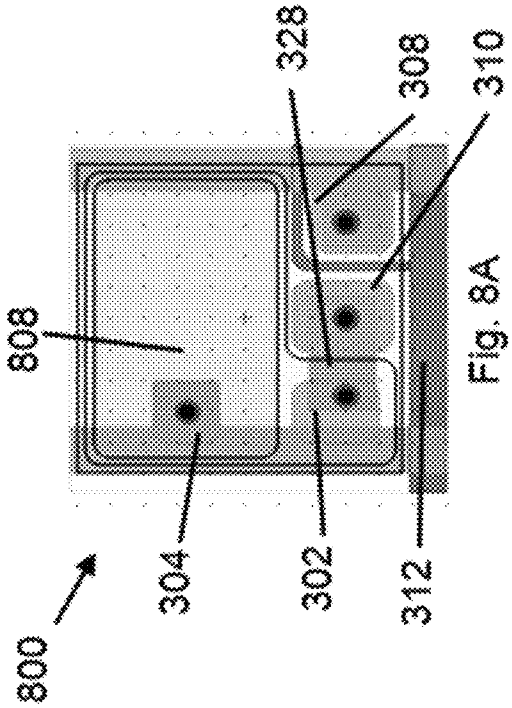
FIGS. 8A, 8B, 8C and 8D are schematic top views of monolithic sensor units which may be fabricated using the method of the invention.
Figure 8B:
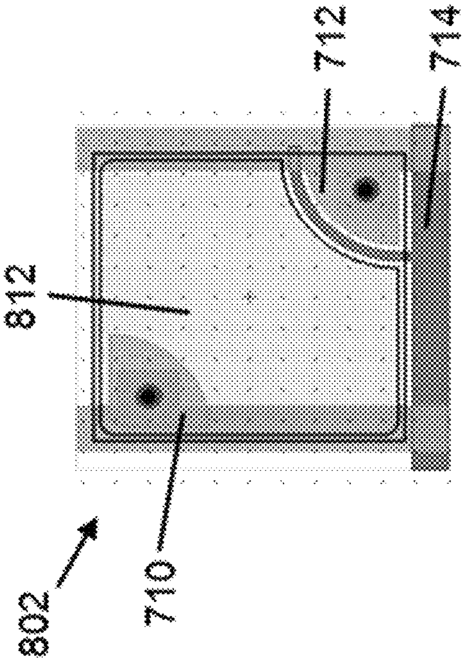
Figure 8C:
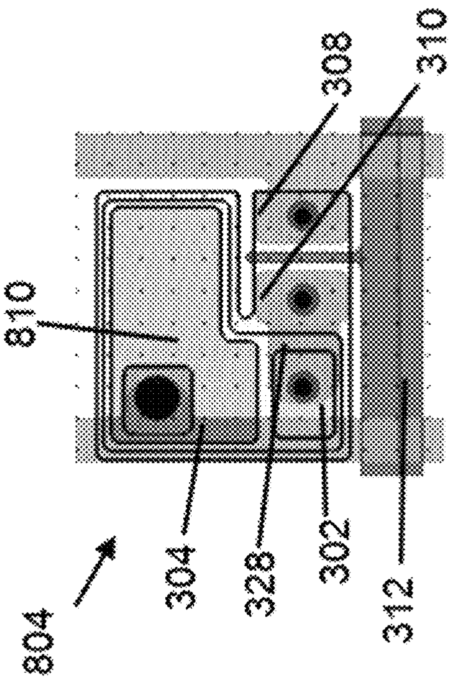
Figure 8D:
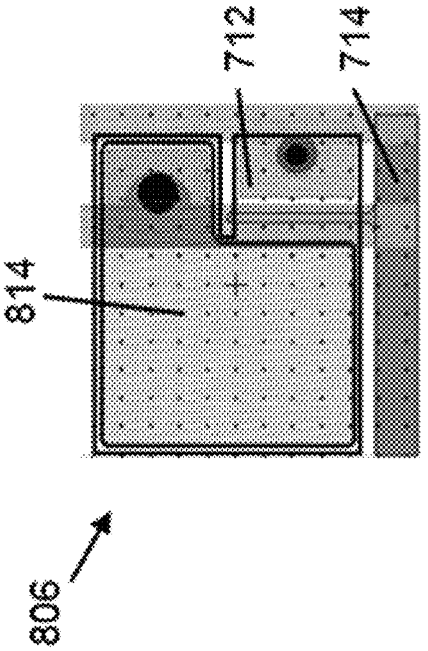

FIGS. 8A and 8B show layouts with L-shaped and curved gate electrodes, respectively. FIGS. 8C and 8D instead both show layouts with straight-shaped gate electrodes. As the gate leakage current of field-effect transistors is higher when curved and L-shaped electrodes are used, the layouts in FIGS. 8A and 8B are more suitable for use with MISFET transistors, for example with a sensor unit having a similar structure to that of FIG. 7B. The layouts in FIGS. 8C and 8D are better suited to MESFET devices.

FIG. 8A is a schematic top view of a sensor unit having a similar structure to that shown in FIG. 3C, whilst FIG. 8B is a schematic top view of a sensor unit having a similar structure to that shown in FIG. 7A. Where reference numbers in FIG. 8A are the same as those in FIG. 3C, they relate to the same features, and the corresponding features are not described again. Where reference numbers in FIG. 8B are the same as those in FIG. 7A, they relate to the same features, and the corresponding features are not described again. The sensor units 800, 804 each have a respective sensing area 808, 810. The sensing area is a region of the photodiode which may receive incident light. The size of the sensing area 808, 810 is limited by the presence of the source and drain electrodes 310, 308 and the first and second photodiode electrodes 302, 304 which occupy a large amount of surface area on the sensor unit 800, 804.

In contrast, the sensor units 802, 806 have a larger sensing areas 812, 814. As shown in FIG. 8B, the sensor unit 802 includes two instead of four electrodes (first contact electrode 710 and second contact electrode 712), such that the total surface area of the sensor unit 802 which is occupied by electrodes is reduced compared to sensor unit 800. This enables the sensing area 806 of the sensor unit 802 to occupy a larger proportion of the total surface area of the sensor unit 802, thus increasing the fill factor.

FIG. 9 is a table 900 showing an example of layers which may form the sensor unit 700 shown in FIG. 7. Several parameters are given for each of the layers listed in table 900, including the layer's thickness, the material from which it is made, dopant material, type of doping, and the carrier concentration. The substrate 702 may include a GaAs substrate layer and an undoped ("UD") GaAs. The first semiconductor device layer includes an n-doped GaAs channel layer 704. The common contact layer 706 is deposited on the channel layer 704 and is formed of highly n-doped GaAs. The second semiconductor device layer 708 is deposited on the common contact layer 706 and includes an undoped multiplication layer made of GaSb, a highly p-doped absorption layer made of InSb, a thin barrier layer and a highly p-doped top contact layer.

In the structure shown in FIG. 9, a field-effect transistor (in this case a MESFET) 902 is formed of the GaAs channel layer 704 and the common contact layer 706. A photodiode 904 is formed of the common contact layer 706 and all the other layers above it. Thus common contact layer 706 acts as a contact layer for both the field-effect transistor 902 and the photodiode 904, as well as an interconnection between the two components.

The photodiode 904 in the example of FIG. 9 is a so-called separate absorption and multiplication (SAM) mid-infrared sensing avalanche photodiode (APD). The GaSb multiplication layer enables charge carrier multiplication (also known as the "avalanche effect") in the photodiode 904. The GaSb multiplication layer also serves a structural function, in that it acts as a buffer layer which enables relaxation of any strain which may be introduced by a lattice mismatch between the GaAs-based common contact layer 706 below it and the InSb-based absorption layer above it. The GaSb layer therefore has multiple functionalities in the structure shown in FIG. 9. Thus, by building new functionalities into existing layers, the overall number of layers in the device may be reduced. This also enables the number of fabrication steps (e.g. lithographic steps) to be reduced in order to simplify the overall fabrication procedure.

Figure 10A:
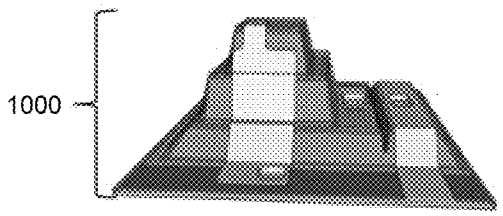
FIGS. 10A-10C are three-dimensional illustrations of monolithic sensor units fabricated using the method of the invention.
Figure 10B:
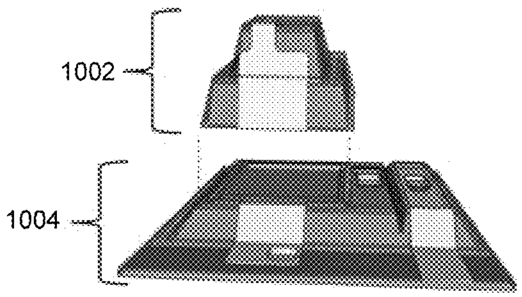
Figure 10C:
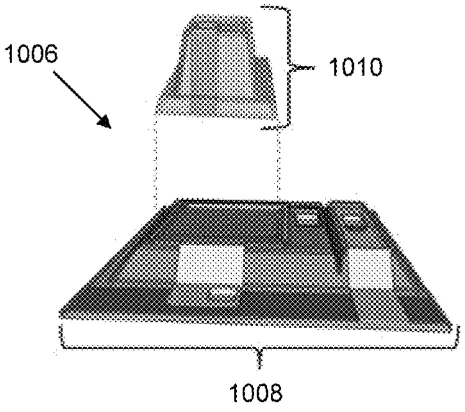

The method of the invention is highly flexible, and can be used to fabricate a wide variety of sensor units. For example, different types of photodiode may be implemented in the sensor unit, depending on the type of application and the range of wavelengths which is to be detected. This is illustrated in FIG. 10A-10C, which show how different photodiode structures may be integrated with a field-effect transistor structure. FIG. 10A shows a three-dimensional illustration of a completed sensor unit 1000. The sensor unit 1000 may be fabricated using the methods described above, and may have a structure similar to that shown in FIG. 3C. FIG. 10B shows a three dimensional illustration of the sensor unit 1000 where the photodiode structure 1002 has been separated from the field-effect transistor structure 1004 for illustration purposes.

FIG. 10C shows a three-dimensional illustration of an alternative sensor unit 1006. The alternative sensor unit 1006 includes a field-effect transistor structure 1008 and a photodiode structure 1010. The field-effect transistor structure 1008 is shown separated from the photodiode structure 1010 for illustration purposes. The field-effect transistor structure 1008 may be similar to the field-effect transistor structure 1004 of the sensor unit 1000. However, the photodiode structure 1010 is different to the photodiode structure 1002 of the sensor unit 1000. The photodiode structure 1010 may include different layers compared to photodiode structure 1002, and may be fabricated using different steps (e.g. different patterning and selective etching steps). Therefore, although the overall structure and general method of fabricating sensor units 1000 and 1006 may be similar, both sensor units include different photodiodes which may have different sensing properties. Additionally, although the field-effect transistor structures 1004 and 1008 are similar, different field-effect structures may also be implemented.

It should also be noted that other types of field-effect structures, other than the above-mentioned MOSFETs may be used. For example, the method of the invention may be used to fabricate other GaAs-based field-effect transistors such as metal-oxide-semiconductor field effect transistors (MOSFETs) and high-electron-mobility transistors (HEMTs). Fabrication of MOSFETs is very similar to that of MESFET as the only difference is the deposition of a thin dielectric between the gate recess etch step and the gate electrode deposition. Ensuring the absence of native oxide is also beneficial in the fabrication of HEMTs to ensure gate uniformity.

The invention therefore provides a highly flexible platform which enables a wide variety of different sensor units having different sensor properties to be implemented. The specific structure of the sensor unit may be varied by altering the layered structure (e.g. layered structure 100) which is used to fabricate the device, as well as details of the fabrication steps. In each case, high uniformity of response across an array of sensor units is ensured by thoroughly removing the native oxide layer before etching the gate recess.

FIG. 11 is a table 1100 showing an example structure of a photodiode 1102 which has been grown on a GaAs substrate 1104. Table 1100 lists the same parameters as table 900 for each layer in the structure. The photodiode 1102 may be grown on a GaAs-based field-effect transistor similar to those discussed above, and may replace the photodiodes in the structures discussed above (e.g. it may replace photodiode structure 1010). The structure of the photodiode 1102 is a bandgap engineered structure based on a type-2 superlattice having alternating thin layers of III-V materials. The structure shown in FIG. 11 is different from standard "p-i-n" photodiode structures, and is known as an "n-B-n" structure as a barrier layer and active region are sandwiched between two n-type contact layers. The top contact layer 1106 and the back contact layer 1108 in this example are both formed of alternating monolayers (ML) of InAs and GaSb which repeat for 25 periods. The photodiode structure of FIG. 11 may be used to realise a photodiode for mid-IR detection. In some cases, n-B-n structures can be engineered for multi-colour functionality depending on an applied bias voltage. For example, such a photodiode may be sensitive to short-wave infrared when a forward bias is applied, and sensitive to mid-wave infrared when a reverse bias is applied. Another way of achieving multi-spectral detection is through a stack of multiple sensing layers.

Figure 12A:
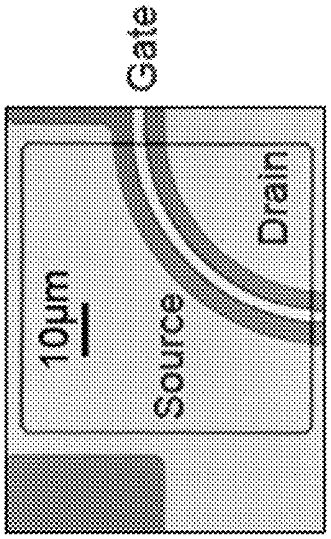
FIG. 12A is a top view of a MESFET having a curved gate electrode.
Figure 12B:
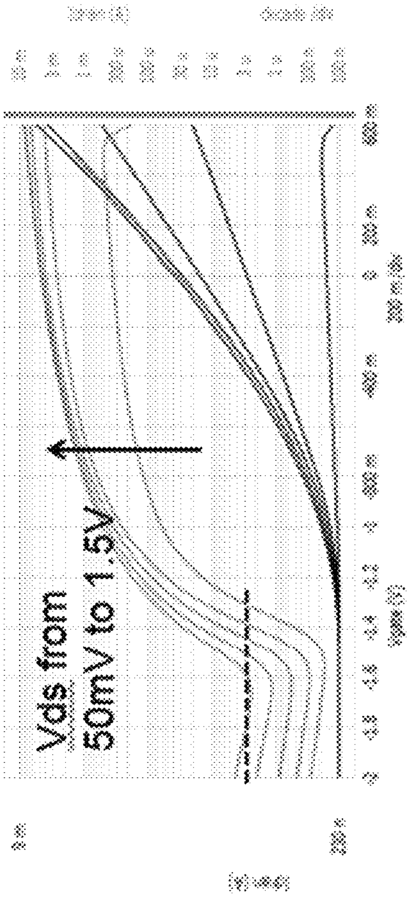
FIG. 12B is a graph showing measured current for varying voltage applied to the gate electrode in the structure of FIG. 12A.
Figure 12C:
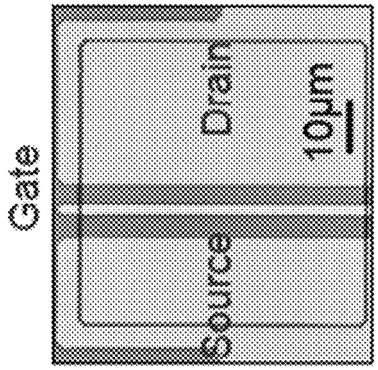
FIG. 12C is a top view of a MESFET having a straight gate electrode.
Figure 12D:
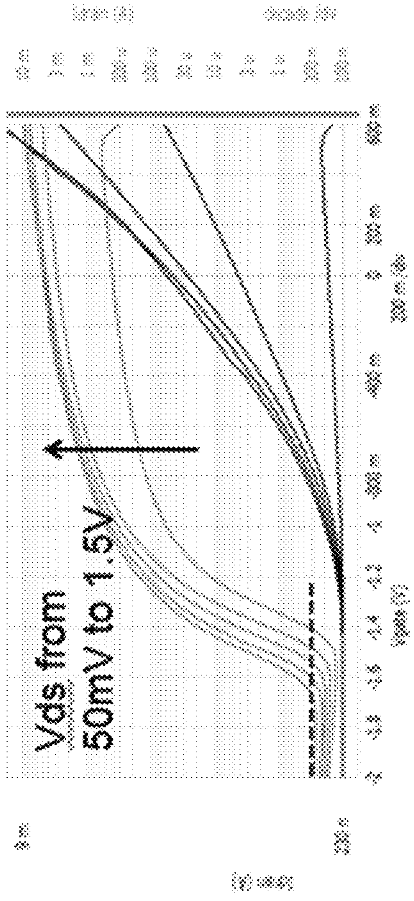
FIG. 12D is a graph showing measured current for varying voltage applied to the gate electrode in the structure of FIG. 12C.

FIGS. 12A-12D illustrate the difference in gate leakage current between a curve-shaped gate electrode and a straight gate electrode. FIG. 12A is a top view of a MESFET with a curve-shaped gate electrode. FIG. 12B shows the current measured when varying the voltage applied to the gate electrode for the device in FIG. 12A. The different curves are obtained when sweeping the voltage between gain and source from 50 mV to 1.5V. FIG. 12C is a top view of a MESFET with a straight gate electrode, and FIG. 12D shows the current measured when varying the voltage applied to the gate electrode for the device in FIG. 12C. The different curves are obtained when sweeping the voltage between gain and source from 50 mV to 1.5V. By comparison of FIGS. 12B and 12D a reduction by a factor of 10 is observed in the current for negative gate voltages (i.e. when the MESFET is in the "off" state).

Figure 13A:
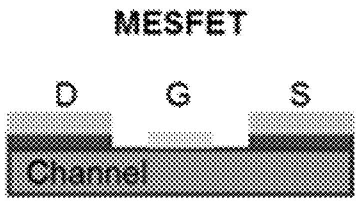
FIGS. 13A and 13B are schematic cross-sectional views through a MESFET and MISFET respectively.
Figure 13B:
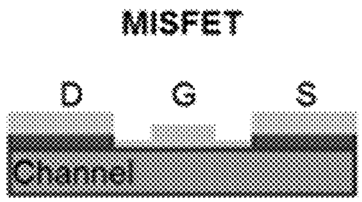
Figure 13C:
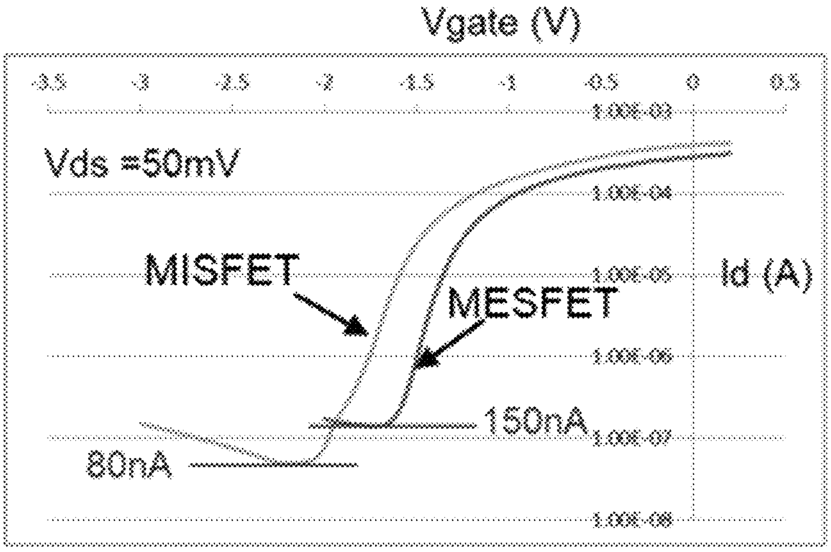
FIG. 13C is a graph illustrating an experimental comparison of a current-voltage characteristic for a MESFET and a MISFET device with the same geometry.

FIGS. 13A-13C provide an illustration of the difference between a MESFET and a MISFET device, with experimental data shown for both. FIG. 13A is a cross-sectional view of a MESFET device, whereas FIG. 13B is a cross-sectional view of a MISFET device. The MISFET device has a thin (~few nm) insulating layer placed between the gate electrode and the gate recess. FIG. 13C shows an experimental comparison between a MESFET and a MISFET device with the same geometry. FIG. 13C shows the current measured through the device when sweeping the gate voltage, at with a fixed voltage 50 mV voltage applied between gate and source. For negative gate voltages (i.e. for the device in the "off" state) the current measured for the MISFET is approximately half of that measured for the MESFET. MISFET devices can then be used in combination with one of the aforementioned monolithic sensor unit to minimise the gate leakage and improve the performance of the monolithic arrays.

The invention claimed is:

1. A method of fabricating a monolithic sensor unit comprising a sensor and field-effect transistor formed within a layered semiconductor stack, the layered semiconductor stack having a substrate, a first semiconductor device layer for forming the field-effect transistor deposited on the substrate and a second semiconductor device layer deposited on the first semiconductor device layer, the second semiconductor device layer providing an active region for the sensor, wherein the method comprises the steps of:

selectively etching a portion of the second semiconductor device layer to expose a surface of the first semiconductor device layer; and performing a wet etch process on a portion of the first semiconductor device layer to form a gate recess in the first semiconductor device layer, wherein the wet etch process comprises:

applying a native oxide removal solution to remove native oxide from the exposed surface of the first semiconductor device layer, and applying an etchant solution to remove material from the first semiconductor device layer and thereby form the gate recess.

2. The method according to claim 1, wherein the step of applying the etchant solution occurs immediately after the step of applying the native oxide removal solution.

3. The method according to claim 1, wherein the wet etch process further comprises applying a surface active agent solution to the exposed surface of the first semiconductor device layer.

4. The method according to claim 3, wherein the step of applying the surface active agent solution occurs immediately before the step of applying the native oxide removal solution.

5. The method according to claim 1, wherein the native oxide removal solution further comprises a surface active agent.

6. The method according to claim 1, wherein the wet etch process is performed repeatedly to obtain a gate recess having a predetermined depth.

7. The method according to claim 6 further comprising the step of detecting a depth of the gate recess during the step of performing the wet etch process.

8. The method according to claim 1, wherein the layered semiconductor stack further comprises a buffer layer between the first semiconductor device layer and the second semiconductor device layer.

9. The method according to claim 1, wherein the sensor is a photodiode sensitive to radiation in the mid-infrared region.

10. The method according to claim 9, wherein the active region of the second semiconductor device layer comprises InSb.

11. The method according to claim 10, wherein the layered semiconductor stack comprises a GaSb buffer layer between the first semiconductor device layer and the second semiconductor device layer, and wherein the step of selectively etching a portion of the second semiconductor device layer further comprises applying a buffer etchant solution for removing the GaSb buffer layer to expose the surface of the first semiconductor device layer.

12. The method according to claim 11, wherein the buffer etchant solution comprises tetramethylammonium hydroxide.

13. The method according to claim 1, wherein the first semiconductor device layer comprises a GaAs channel layer for the field-effect transistor.

14. The method according to claim 1 further comprising depositing a gate electrode in the gate recess to form a gate electrode of the field-effect transistor.

15. The method according to claim 14 further comprising, before depositing the gate electrode in the gate recess, depositing an insulating layer in the gate recess.

16. The method according to claim 1 further comprising depositing a source electrode and a drain electrode on the surface of the first semiconductor device layer to form a source electrode and drain electrode of the field-effect transistor, respectively.

17. The method according to claim 16, wherein the second semiconductor device layer is a multilayer comprising:

a first contact layer having a first sensor electrode thereon, an active layer deposited on the first contact layer, and a second contact layer deposited on the active layer and having a second sensor electrode thereon, and wherein the method further comprising the steps of:

depositing a planarising section to form a ramp between the first sensor electrode and the drain electrode; and depositing an interconnection on the planarising section to electrically connect the first sensor electrode to the drain electrode.

18. The method according to claim 1 wherein the layered semiconductor stack comprises a common contact layer for the first semiconductor device layer and the second semiconductor device layer, and wherein the method comprises:

depositing a first contact electrode on the surface of the first semiconductor device layer; and depositing a second contact electrode on a surface of the second semiconductor device layer;

wherein the first contact electrode and the second contact electrode are arranged such that a current between the first contact electrode and the second contact electrode is controllable based on a bias voltage applied to the gate electrode.

19. The method according to claim 1 applied simultaneously at a plurality of locations on a common substrate to form an array of sensor units.

20. A monolithic sensor unit having a sensor integrated with a field-effect transistor, the sensor unit having a layered semiconductor stack comprising:

a substrate;

a first semiconductor device layer forming the field-effect transistor deposited on the substrate;

a second semiconductor device layer deposited on the first semiconductor device layer, the second semiconductor device layer providing an active region for the sensor;

a common contact layer disposed between the first semiconductor device layer and the second semiconductor device layer;

a first contact electrode deposited on a surface of the first semiconductor device layer;

a second contact electrode deposited on a surface of the second semiconductor device layer; and a gate electrode for the field-effect transistor disposed in a gate recess formed in the first semiconductor device layer, wherein the field-effect transistor is arranged to control, based on a bias voltage applied to the gate electrode, a current flowing between the first contact electrode and the second contact electrode.

21. The monolithic sensor unit according to claim 20, wherein the layered semiconductor stack comprises a buffer layer for relaxing strain arising from a lattice mismatch between the first semiconductor device layer and the second semiconductor device layer.

22. The monolithic sensor unit according to claim 21, wherein the sensor is a photodiode, and wherein the buffer layer enables charge carrier multiplication in the photodiode.

23. The monolithic sensor unit according to claim 21, wherein the photodiode comprises an absorption region comprises InSb, and wherein the buffer layer comprises GaSb.

24. The monolithic sensor unit according to claim 20, wherein the first semiconductor device layer comprises a GaAs channel layer for the field-effect transistor.

25. A focal plane array comprising a plurality of monolithic sensor units according to claim 20 formed on a common substrate.

* * * * *